United States Patent [19]

Segawa et al.

[11] 4,384,220

[45] May 17, 1983

[54] MOS TRANSISTOR CIRCUIT WITH A POWER-DOWN FUNCTION

[75] Inventors: Makoto Segawa, Yokohama; Shoji Ariizumi, Tokyo, both of Japan

[73] Assignee: Tokyo Shibaura Denki Kabushiki Kaisha, Kanagawa, Japan

[21] Appl. No.: 229,746

[22] Filed: Jan. 29, 1981

[30] Foreign Application Priority Data

Feb. 6, 1980 [JP] Japan .................................. 55-13302

[51] Int. Cl.$^3$ ................ H03K 17/687; H03K 19/094; H03K 19/20

[52] U.S. Cl. .................................. 307/450; 307/304; 307/468; 307/581; 365/227

[58] Field of Search ....................... 365/227, 226, 230; 307/443, 445, 448–450, 463, 464, 465, 468, 473, 572, 581, 584, 304

[56] References Cited

U.S. PATENT DOCUMENTS 4,094,012 6/1978 Perlegos et al. .................... 365/226
4,096,584 6/1978 Owen et al. ......................... 365/227
4,264,828 4/1981 Perlegos et al. .................... 307/463

*Primary Examiner*—Stanley D. Miller
*Assistant Examiner*—David R. Hudspeth
*Attorney, Agent, or Firm*—Finnegan, Henderson, Farabow, Garrett & Dunner

[57] ABSTRACT

An MOS transistor circuit contains at least one "zero" threshold mode transistor to provide a power-down function for the circuit. The "zero" threshold mode transistor is connected between an enhancement-mode MOS driver transistor and a depletion-mode MOS load transistor.

11 Claims, 10 Drawing Figures

E/D INVERTER CIRCUIT

PUSH-PULL CIRCUIT

E/D INVERTER CIRCUIT

PUSH-PULL CIRCUIT

E/D INVERTER CIRCUIT

PUSH-PULL CIRCUIT

ADDRESS BUFFER CIRCUIT

MOS TRANSISTOR CIRCUIT WITH A POWER-DOWN FUNCTION

BACKGROUND OF THE INVENTION

This invention relates to MOS transistor circuits with a power-down functions, and more particularly, to such transistor circuits which include a "zero" threshold-mode MOS transistor. A "zero" threshold-mode transistor is a transistor which has a threshold voltage of approximately zero volts.

A "power-down function" is a feature which reduces the power consumption of a circuit when it is not active. MOS transistor circuits having power-down functions are now being used in integrated circuits (ICs).

A fertile area for such MOS circuits is the area of integrated circuit memory chips used in computer memory systems. Only a few memory chips are active during any computer memory access. The active chips, which are usually enabled by a chip select (CS) or chip enable (CE) signal, are said to be in an "operation" mode, while the inactive chips are said to be in a "standby" mode.

Some examples of MOS transistor circuits with power-down functions are shown in U.S. Pat. No. 4,096,584 to Owen III, et al.

The circuit shown in FIG. 2A of Owen III, et al. can be used in a static RAM system. This circuit uses a depletion-mode MOS transistor as a load, an enhancement-mode MOS transistor as a driver, and an enhancement-mode MOS transistor for a power-down function, the gate of the power-down transistor receiving a chip enable signal. The problem with this circuit is that the source of the MOS driver transistor is not easily brought to ground potential because of the significant voltage drop across the power-down MOS transistor.

In response to this problem, a "zero" threshold-mode MOS transistor was used in the circuit shown in FIG. 2B of Owen III, et al. and reproduced herein as FIG. 1A. The E/D inverter circuit shown in FIG. 1A uses depletion-mode MOS transistor $Tr_{D1A}$ as the load, enhancement-mode MOS transistor $Tr_{E1A}$ as the driver, and "zero" threshold-mode MOS transistor $Tr_{P1A}$ for a power down function.

MOS transistor $Tr_{E1A}$ has its source connected to ground, and its gate receives input signal $V_{in}$. The drain of $Tr_{E1A}$ is connected to both the source and gate of transistor $Tr_{D1A}$.

Transistor $Tr_{P1A}$'s source is connected to $Tr_{D1A}$'s drain, and the gate of $Tr_{P1A}$ receives circuit enable signal CS. $Tr_{P1A}$'s drain connects to a voltage $V_{cc}$.

The circuit in FIG. 1A is more suitable for integrated circuits than is the circuit shown in FIG. 2A of Owen III, et al. because of the "zero" threshold-mode transistor $Tr_{P1A}$. Unfortunately, the E/D inverter circuit in FIG. 1A has its own problems when used in ICs. This circuit requires either that the load transistor $Tr_{D1A}$ be large or that the circuit's switching speed be slow. This characteristic is particularly disadvantageous when this circuit, i.e. one having a "zero" threshold-mode MOS transistor, is used in a Push-Pull inverter circuit which drives a large capacitive load.

An MOS Push-Pull inverter circuit similar to the inverter in FIG. 1A is shown in FIG. 1B. This Push-Pull inverter circuit used an E/D inverter circuit with a "zero" threshold-mode MOS transistor $Tr_{E1B}$ to provide a power-down function. The circuit also has a depletion-mode MOS transistor $Tr_{D1B}$ and an enhancement-mode MOS transistor $Tr_{E1B}$.

The MOS transistor $Tr_{E1B}$ has its source connected to ground, and its gate to input signal $V_{in}$. Transistor $Tr_{D1B}$'s source connects to the drain of transistor $Tr_{D1B}$, and the gate of $Tr_{P1B}$ receives the inverter input signal $\overline{V_{in}}$. The souce of $Tr_{P1B}$ is connected to the drain of $Tr_{D1B}$. $Tr_{P1B}$'s gate receives circuit enable signal CS, and its drain connects to voltage $V_{cc}$.

This MOS Push-Pull inverter circuit, however, requires that transistor $Tr_{P1B}$ be unduly large to avoid slow switching speeds.

SUMMARY OF THE INVENTION

Accordingly, one object of this invention is to imrpove MOS transistor integrated circuits having a power-down function.

Another object of this invention is to increase the switching speed of MOS transistor circuits which include a "zero" threshold-mode MOS transistor for a power-down function without increasing the size of such circuits.

A further object of this invention is to improve MOS transistor E/D inverter or Push-Pull inverter circuits having a power-down function.

Additional objects and advantages of the invention will be set forth in part in the description which follows and in part will be apparent from that description. The objects and advantages of the invention may be realized and obtained by means of the instrumentalities and combinations particularly pointed out in the appended claims.

To achieve the objects and in accordance with the purpose of the invention, as embodied and as broadly described herein, the transistor circuit of this invention has a first input terminal, a second input terminal, an output terminal and a circuit enable terminal, and comprises a depletion-mode MOS transistor having a source, a drain and a gate, the latter gate being connected to the first input terminal; an enhancement-mode MOS transistor having a drain, a source, and a gate, the latter gate being connected to the second input terminal; and an MOS transistor connected between the depletion-mode transistor and the enhancement-mode transistor for providing a power-down function, the power-down function transistor having a threshold voltage of approximately zero volts and also having a drain connected to the source of the depletion-mode transistor, a source connected to the drain of the enhancement-mode transistor, and a gate connected to the circuit enable terminal.

The accompanying drawings, which are incorporated in and constitute a part of this specification, illustrate the invention, and, together with the description, serve to explain the principles of the invention.

DESCRIPTION OF THE PREFERRED EMBODIMENTS

Reference will now be made in detail to the present preferred embodiment of the invention, an example of which is illustrated in the accompanying drawings.

Figure 2A:
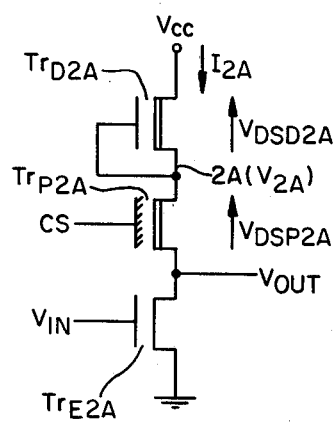
FIG. 2A shows an MOS transistor E/D inverter circuit with a power-down function according to this invention.

FIG. 2A shows an MOS transistor E/D inverter circuit with a power-down function according to this invention.

The circuit comprises an enhancement-mode transistor $Tr_{E2A}$ as a driver, a depletion-mode MOS transistor $Tr_{D2A}$ as a load, and an MOS transistor $Tr_{P2A}$ for a power-down function. The power-down function transistor has a threshold voltage of approximately zero volts (e.g., between $-0.5$ V to 0.2 V). Transistors $Tr_{E2A}$, $Tr_{D2A}$, and $Tr_{P2A}$ are n-channel MOS transistors.

The threshold voltages of the transistors have the following feature:

$$Vth_{D2A} < Vth_{P2A} < Vth_{E2A}$$

($Vth_{D2A}$ is the threshold voltage of transistor $Tr_{D2A}$, $Vth_{P2A}$ is the threshold voltage of transistor $Tr_{P2A}$, and $Vth_{E2A}$ is the threshold voltage of transistor $Tr_{E2A}$).

In FIG. 2A, MOS transistor $Tr_{E2A}$ has its source connected to ground, and its gate receives input signal $V_{in}$. The drain of $Tr_{D2A}$ connects to the power supply voltage $V_{cc}$.

Connected between the enhancement-mode transistor $Tr_{E2A}$ and the depletion-mode transistor $Tr_{D2A}$, is "zero" threshold transistor $Tr_{P2A}$. $Tr_{P2A}$'s source is connected to the drain of $Tr_{E2A}$ and $Tr_{P2A}$'s drain is connected to both the source and the gate of $Tr_{D2A}$.

The gate of $Tr_{P2A}$ receives a circuit enable signal, for example, a chip select (CS) or a chip enable (CE) signal. When this circuit enable signal is "1", transistor $Tr_{P2A}$ is in an "operation" mode and conducts. When the circuit enable signal is "0", $Tr_{P2A}$ is in the "standby" mode and ceases mostly conducting.

In the inverter shown in FIG. 2A, the output signal $V_{out}$ is at the drain of $Tr_{E2A}$.

Figure 3A:
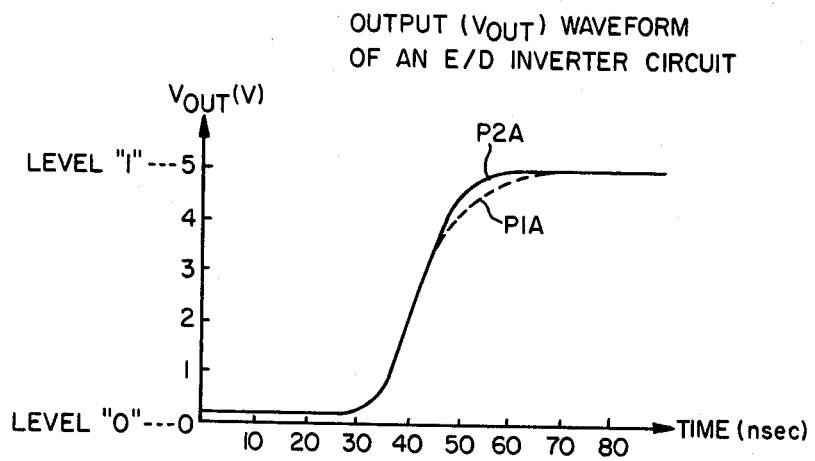
FIG. 3A illustrates output waveforms of the circuit of FIG. 1A and the circuit of FIG. 2A.

FIG. 3A shows a waveform P2A, which corresponds to the output signal $V_{out}$ in FIG. 2A as it changes from a "0" to a "1". P1A, represented by a dotted line in FIG. 3A, is the waveform of the output signal $V_{out}$ in FIG. 1A as it changes from a "0" to a "1". These waveforms were obtained by a computer analysis of models of the transistors in the circuits. The same values for size of the transistors, the input waveform and the load capacitance were used in the models for both the circuit in FIG. 2A and the circuit in FIG. 1A.

Figure 1A:
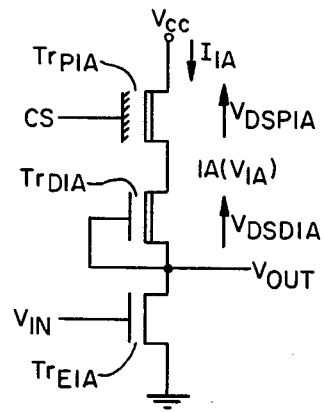
FIG. 1A shows a conventional MOS transistor E/D inverter circuit with a power-down function.

As is apparent from FIG. 3A, $V_{out}$ in FIG. 2A, P2A, changes from "0" to "1" more quickly than does $V_{out}$ of FIG. 1A, P1A. Thus, the circuit shown in FIG. 2A switches faster than does the circuit in FIG. 1A when the sizes of the transistors, the input waveforms, and the load capacitances in both circuits are equal.

The results of the computer analysis also mean that the size of the transistors used in the circuit of FIG. 2A can be smaller than those used in the circuit of FIG. 1A if the two circuits operate at the same speed.

The differences between the E/D inverter circuit is FIG. 1A and the E/D inverter circuit of this invention shown in FIG. 2A are made more apparent by the following analysis. In this analysis, the circuits have the following conditions a-f:

(a) The level of the signal CS is "1" (=5 V).

(b) The input signal $V_{in}$ changes from "1" (=5 V) to "0" (=0 V), and the output signal $V_{out}$ changes from "0" (=0 V) to "1" (=5 V). In this analysis $V_{out}$ is 4 V.

(c) The transistors $Tr_{P1A}$ and $Tr_{P2A}$ operate in the triode region. Both transistors' threshold voltages, $Vth_{P1A}$ and $Vth_{P2A}$, are $-0.3$ V.

(d) The transistors $Tr_{D1A}$ and $Tr_{D2A}$ operate in the triode region. The threshold voltages of $Tr_{D1A}$ and $Tr_{D2A}$, $Vth_{D1A}$ and $Vth_{D2A}$, respectively, have the following relationship:

$$|V_{DSD1A}| < |Vth_{D1A}|, \quad |V_{DSD2A}| < |Vth_{D2A}|.$$

$V_{DSD1A}$ is the voltage between the drain and the source of $Tr_{D1A}$, and $V_{DSD2A}$ is the voltage between the drain and the source of $Tr_{D2A}$. Both $Vth_{D1A}$ and $Vth_{D2A}$ are $-3$ V.

(e) $\beta_{P1A}/\beta_{D1A} = \beta_{P2A}/\beta_{P1A} = 2$. $\beta_{P1A}$, $\beta_{D1A}$, $\beta_{P2A}$ and $\beta_{D2A}$ are the $\beta$'s of the transistors $Tr_{P1A}$, $Tr_{D1A}$, $Tr_{P2A}$ and $Tr_{D2A}$, respectively. Generally, $\beta = \mu \cdot \epsilon_{0X} \cdot \epsilon_0 / t_{OX} \cdot (W/L)$, where $\mu$ is the carrier mobility value, $\epsilon_{0X}$ is the relative dielectric constant of SiO2, $\epsilon_0$ is a constant ($=8.85 \, 10^{-14}$F/cm), $t_{OX}$ is the gate oxide thickness, W is the channel width, and L is the channel length.

(f) $V_{cc} = 5$ V.

$V_{DSP1A}$ is the voltage between the drain and the source of the transistor $Tr_{P1A}$, and $V_{DSP2A}$ is the voltage between the drain and the source of the transistor $Tr_{P2A}$.

$V_{1A}$ is the voltage between the source 1A of transistor $Tr_{P1A}$ and ground, and $V_{2A}$ is the voltage between the source 2A of transistor $Tr_{D2A}$ and ground.

The current $I_{1A}$ in the circuit of FIG. 1A is the current which runs from the power source $V_{cc}$ to ground. In transistor $Tr_{P1A}$, $$I_{1A} = \beta_{P1A}[\{(CS - V_{1A}) - Vth_{P1A}\}V_{DSP1A} - V_{DSP1A}^2/2]. \quad (1)$$

Also in transistor $Tr_{D1A}$, $$I_{1A} = \beta_{D1A}\{(0 - Vth_{D1A})V_{DSD1A} - V_{DSD1A}^2/2\}. \quad (2)$$

Equations 1 and 2 are equal, so $$\tfrac{1}{2}(\beta_{P1A}/\beta_{D1A} + 1)V_{DSP1A}^2 - (\beta_{P1A}/\beta_{D1A} \cdot Vth_{P1A} + Vth_{D1A} + V_{cc} - V_{out})V_{DSP1A} + Vth_{D1A}(V_{cc} - V_{out}) = 0. \quad (3)$$

The current $I_{2A}$ is the current from the power source to ground in the circuit of FIG. 2A. In transistor $Tr_{D2A}$, $$I_{2A} = \beta_{D2A}\{(0 - Vth_{D2A})V_{DSD2A} - V_{DSD2A}^2/2\}. \quad (4)$$

In transistor $Tr_{P2A}$, $$I_{2A} = \beta_{P2A}\{(CS - V_{out} - Vth_{P2A})V_{DSP2A} - V_{DSP2A}^2/2\}. \quad (5)$$

Equations 4 and 5 are equal, so, $$\tfrac{1}{2}(1-\beta_{P2A}/\beta_{D2A})V_{DSP2A}^2 + \{\beta_{P2A}/\beta_{D2A} \cdot (V_{cc}-V_{out}-Vth_{P2A})-Vth_{D2A}-(V_{cc}-V_{out})\}V_{DSP2A}+Vth_{D2A}(V_{cc}-V_{out})=0. \quad (6)$$

From equations 1, 3, 4 and 6, and the conditions identified above ($V_{out}=4$ V, $\beta_{P1A}/\beta_{D1A}=\beta_{P2A}/\beta_{D2A}=2$, $V_{cc}=5$ V, $Vth_{D1A}=Vth_{D2A}=-3$ V, and $Vth_{P1A}=Vth_{P2A}=-0.3$ V), $$V_{DSP1A}=0.79 \text{ V}, \quad (7a)$$
$$V_{DSP2A}=0.61 \text{ V}, \quad (7b)$$
$$I_{1A}=0.55\beta_{P1A}, \quad (8a)$$
$$I_{2A}=0.61\beta_{P2A}. \quad (8b)$$

From Equations 8a and 8b, $I_{1A}<I_{2A}$ when $\beta_{P1A}=\beta_{P2A}$, or in other words, the current $I_{2A}$ in FIG. 2A is larger than the current $I_{1A}$ in FIG. 1A when the transistors in the circuits of FIG. 1A and FIG. 2A have the same dimensions.

It is equally true that transistor $Tr_{P2A}$ can be smaller than transistor $Tr_{P1A}$ when the current $I_{1A}$ is the same as the current $I_{2A}$, i.e. when the drive capabilities of the transistors $Tr_{P2A}$ and $Tr_{P1A}$ are the same. The leakage current of $Tr_{P2A}$ in the "standby" mode will be smaller when $Tr_{P2A}$ is smaller.

Figure 2B:
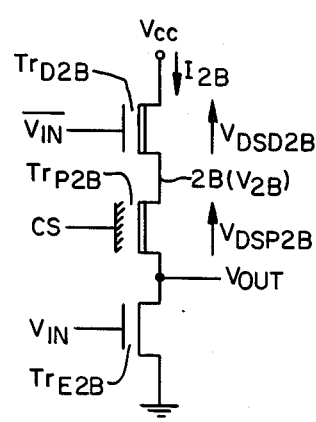
FIG. 2B shows an MOS transistor Push-Pull inverter circuit with a power-down function according to the present invention.

FIG. 2B shows a Push-Pull inverter circuit. One difference between this circuit and the circuit in FIG. 2A is that the depletion-mode transistor $Tr_{D2A}$ in FIG. 2A has its gate connected to its source. The gate of the depletion-mode MOS transistor $Tr_{D2B}$ receives the inverted input signal $\overline{V_{in}}$. Otherwise, the circuits in FIGS. 2B and 2A have substantially the same structure.

The MOS transistor circuit with a power-down function of FIG. 2B uses an enhancement-mode MOS transistor $Tr_{E2B}$ as a driver, a depletion-mode MOS transistor $Tr_{D2B}$ as a load, and a "zero" threshold-mode MOS transistor $Tr_{P2B}$ for a power-down function. The power-down transistor's threshold voltage is between $-0.5$ V to 0.2 V. All the transistors are n-channel MOS transistors.

The threshold voltages of the transistors in the circuit have the following relationship:
$Vth_{D2B} < Vth_{P2B} < Vth_{E2B}$.

$Vth_{D2B}$ is the threshold voltage of transistor $Tr_{D2B}$, $Vth_{P2B}$ is the threshold voltage of transistor $Tr_{P2B}$, and $Vth_{E2B}$ is the threshold voltage of transistor $Tr_{E2B}$.

As in the circuit of FIG. 2A, the "zero" threshold-mode MOS transistor $Tr_{P2B}$ is connected between the enhancement-mode MOS transistor $Tr_{E2B}$ and depletion-mode MOS transistor $Tr_{D2B}$.

Transistor $Tr_{E2B}$ has its source connected to ground and its gate receives input signal $V_{in}$. The drain of MOS transistor $Tr_{D2B}$ is connected to a positive voltage $V_{cc}$ and the gate of $Tr_{D2B}$ receives inverted input signal $\overline{V_{in}}$.

"Zero" threshold-mold transistor $Tr_{P2B}$ is connected between the load and driver transistors, $Tr_{D2B}$ and $Tr_{E2B}$ respectively. The drain of driver transistor $Tr_{E2B}$ is connected to the source of transistor $Tr_{P2B}$ and the drain of $Tr_{P2B}$ connects to the source of $Tr_{D2B}$.

Transistor $Tr_{P2B}$'s gate receives the circuit enable signal, which can be, for example, a chip select (CS) or a chip enable (CE) signal. When this signal is "1", the transistor $Tr_{P2B}$ conducts, and when the signal is "0", $Tr_{P2B}$ ceases mostly to conduct.

The circuit of FIG. 2B is in a "standby" mode, when the level of chip select signal (CS) is "0". Transistor $Tr_{P2B}$ is then in a power down state, i.e., nonconducting or almost nonconducting. In this state, substantially no current $I_{2B}$ flows through transistors $Tr_{D2B}$, $Tr_{P2B}$ and $Tr_{E2B}$. In the "operation" mode, the chip select signal is "1", and transistor $Tr_{P2B}$ is conducting.

Output signal $V_{out}$, at the drain of $Tr_{E2B}$, has the same level as the inverted input signal, $\overline{V_{in}}$. The load conductivity of $Tr_{D2B}$ changes with the level of $\overline{V_{in}}$.

Figure 3B:
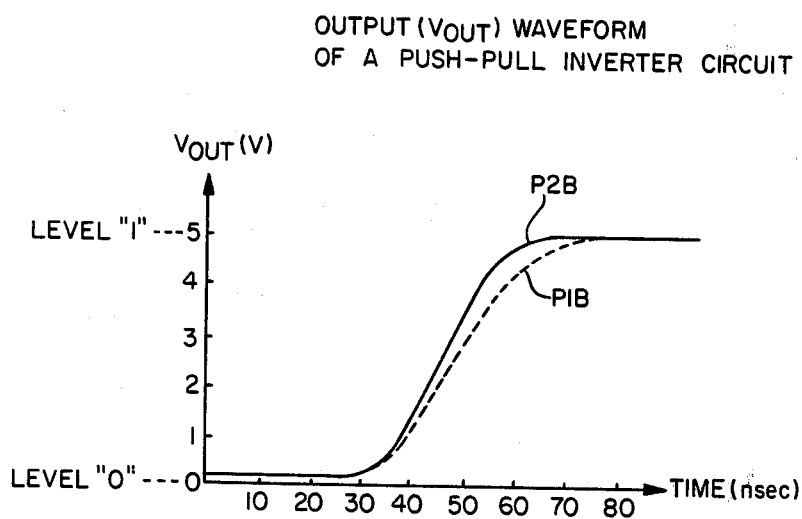
FIG. 3B illustrates output waveforms of the circuit of FIG. 1B and the circuit of FIG. 2B.

FIG. 3B shows a waveform, P2B, of the $V_{out}$ signal of FIG. 2B, as it changes levels from "0" to "1". Waveform P1B of the $V_{out}$ signal of FIG. 1B is shown changing from "0" to "1" by a dotted line in FIG. 3B.

These waveforms were obtained by a computer analysis of MOS transistor models. The models used the same values for transistor size, the input waveform, and load capacitance for both the circuits in FIG. 2B and FIG. 1B.

Figure 1B:
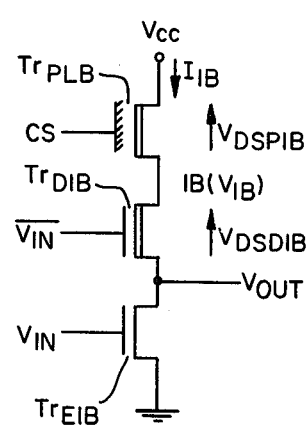
FIG. 1B shows a conventional MOS transistor Push-Pull inverter circuit will a power-down function.

As is apparent from FIG. 3B, the output signal $V_{out}$ of the circuit in FIG. 2B (corresponding to the waveform P2B) changes from "0" to "1" more quickly than does the output signal $V_{out}$ of the circuit in FIG. 1B (corresponding to the waveform P1B).

Consequently, the circuit in FIG. 2B is faster than that of the circuit in FIG. 1B when the size of the transistors, the input waveforms and the load capacitances in the two circuits are the same. Alternatively, if the switching speeds of the two circuits are the same, the size of a transistor used in the circuit of FIG. 2B can be smaller than that used in the circuit of FIG. 1B.

A comparison of FIGS. 3B and 3A, shows that the increase in switching speed of the present invention used in a Push-Pull inverter circuit is more marked than it is when the invention is used in an E/D inverter circuit.

The differences between the Push-Pull inverter circuits in FIG. 1B and FIG. 2B will be even more apparent by the following analysis. In this analysis, both circuits have the following conditions a–f:

(a) The level of the signal CS is "1" (=5 V).
(b) Input signal $V_{in}$ changes from "1" (=5 V) to "0" (=0 V), and the output signal $V_{out}$ changes from "0" (=0 V) to "1" (=5 V). In this analysis, $V_{out}$ is now 0 V.
(c) Transistors $Tr_{P1B}$ and $Tr_{P2B}$ operate in the triode region. The threshold voltages of $Tr_{P1B}$ and $Tr_{P2B}$, $Vth_{P1B}$ and $Vth_{P2B}$, respectively, are both $-0.3$ V.
(d) The transistors $Tr_{D1B}$ and $Tr_{D2B}$ operate in the triode region. Both the threshold voltages $Vth_{D1B}$ of transistor $Tr_{D1B}$ and $Vth_{D2B}$ of transistor $Tr_{D2B}$ are $-3$ V.
(e) $\beta_{P1B}/\beta_{D1B}=\beta_{P2B}/\beta_{D2B}=7$. $\beta_{P1B}$, $\beta_{D1B}$, $\beta_{P2B}$ and $\beta_{D2B}$ are the $\beta$s of the transistors $Tr_{P1B}$, $Tr_{D1B}$, $Tr_{P2B}$ and $Tr_{D2B}$, respectively.
(f) $V_{cc}=5$ V.

$V_{DSD1B}$ is the voltage between the drain and the source of the transistor $Tr_{D1B}$, and $V_{DSD2B}$ is the voltage between the drain and the source of the transistor $Tr_{D2B}$. $V_{DSP1B}$ is the voltage between the drain and the source of the transistor $Tr_{P1B}$, and $V_{DSP2B}$ is the voltage between the drain and the source of the transistor $Tr_{P2B}$.

$V_{1B}$ is the voltage between the source 1B of the transistor $Tr_{P1B}$ and ground, and $V_{2B}$ is the voltage between the source 2B of the transistor $Tr_{D2B}$ and ground.

The current $I_{1B}$ is the current which runs from the power source $V_{cc}$ to ground in the circuit of FIG. 1B, and the current $I_{2B}$ is the current which runs from the power source $V_{cc}$ to ground in the circuit of FIG. 2B. In transistor $Tr_{P1B}$, $$I_{1B} = \beta_{P1B}\{[(CS - V_{1B}) - Vth_{P1B}]V_{DSP1B} - V_{DSP1B}^2/2\}. \quad (9)$$

Also in transistor $Tr_{D1B}$, $$I_{1B} = \beta_{D1B}[\{(\overline{V_{in}} - V_{out}) - Vth_{D1B}\}V_{DSD1B} - V_{DSD1B}^2/2]. \quad (10)$$

Equation 9 = Equation 10, so $$\tfrac{1}{2}(\beta_{P1B}/\beta_{D1B} + 1)V_{DSP1B}^2 - (\beta_{P1B}/\beta_{D1B} \cdot Vth_{P1B} + Vth_{D1B})V_{DSP1B} - \tfrac{1}{2}V_{cc}^2 + Vth_{D1B} \cdot V_{cc} = 0. \quad (11)$$

In transistor $Tr_{D2B}$, $$I_{2B} = \beta_{D2B}[\{(\overline{V_{in}} - V_{2B}) - Vth_{D2B}\}V_{DSD2B} - V_{DSD2B}^2/2]. \quad (12)$$

In transistor $Tr_{P2B}$, $$I_{2B} = \beta_{P2B}[\{(CS - V_{out}) - Vth_{P2B}\}V_{DSP2B} - V_{DSP2B}^2/2]. \quad (13)$$

Equation 12 = Equation 13, so $$\tfrac{1}{2}(\beta_{P2B}/\beta_{D2B} + 1)V_{DSP2B}^2 - \{(1 + \beta_{P2B}/\beta_{D2B})V_{cc} - Vth_{D2B} - \beta_{P2B}/\beta_{D2B} \cdot Vth_{P2B}\}V_{DSP2B} + \tfrac{1}{2}V_{cc}^2 - Vth_{D2B} \cdot V_{cc} = 0. \quad (14)$$

From Equations 9, 11, 12, and 14, and the above conditions ($\beta_{P1B}/\beta_{D1B} = \beta_{P2B}/\beta_{D2B} = 7$, $V_{cc} = 5$ V, $Vth_{D1B} = Vth_{D2B} = -3$ V, and $Vth_{P1B} = Vth_{P2B} = -0.3$ V), $$V_{DSP1B} = 2.06\ V, \quad (15a)$$
$$V_{DSP2B} = 0.65\ V, \quad (15b)$$
$$I_{1B} = 2.74\,\beta_{P1B}, \quad (16a)$$
$$I_{2B} = 3.23\,\beta_{P2B}, \quad (16b)$$
$$V_{1B} = 2.94\ V. \quad (17)$$

From 16a and 16b, $I_{1B} < I_{2B}$ when $\beta_{P1B} = \beta_{P2B}$. In other words, the current $I_{2B}$ in the circuit of FIG. 2B is larger than the current $I_{1B}$ in the circuit of FIG. 1B when the dimensions of the corresponding transistors in the circuits of FIG. 1B and FIG. 2B are the same. Alternatively, the size of the transistor $Tr_{P2B}$ is smaller than that of transistor $Tr_{P1B}$ when the currents $I_{1B}$ and $I_{2B}$ are equal.

From Equation 17, it is apparent that some back bias voltage (2.94 V) occurs in $Tr_{P1B}$ of the Push-Pull inverter circuit in FIG. 1B. $Tr_{P2B}$ has no back bias voltage when $V_{out}$ is 0 V. This absence of a back voltage allows the transistor $Tr_{P2B}$ to be smaller than $Tr_{P1B}$ when the drive capabilities of the two transistors are the same. If $Tr_{P2B}$ is smaller, its leakage current during standby mode will be smaller.

Furthermore, during the "operation" mode, when the inverted signal $\overline{V_{in}}$ is "0", the current through the transistor $Tr_{D2B}$ is smaller than that which runs through the transistor $Tr_{D1B}$ because the source of the transistor $Tr_{D2B}$ is connected to ground through the transistor $Tr_{P2B}$.

Figure 4:
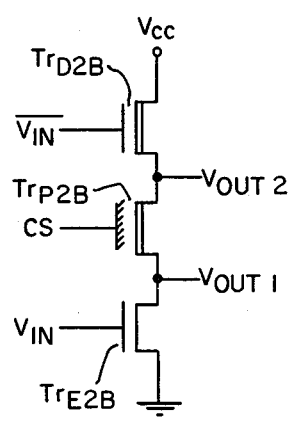
FIG. 4 shows another MOS transistor Push-Pull inverter circuit with a power-down function according to the present invention.

FIG. 4 shows another embodiment of an MOS transistor Push-Pull inverter circuit having a power-down function according to this invention. The only difference between the circuit in FIG. 4 and that in FIG. 2B is the output signals.

The elements of the inverters in FIG. 4 and FIG. 2B which are the same have the same labels and will not be redescribed. Two output signals, $V_{out1}$ and $V_{out2}$, are used in the circuit in FIG. 4.

One output signal, $V_{out1}$, is taken from the drain of enhancement-mode MOS transistor $Tr_{E2B}$. $V_{out1}$ corresponds to output signal $V_{out}$ in FIG. 2B. The other output, $V_{out2}$, is taken from the drain of "zero" threshold-mode MOS transistor $Tr_{P2B}$. In the embodiment in FIG. 4, it is preferable that the threshold voltage of the transistor $Tr_{P2B}$ be less than 0 volts.

According to this embodiment, output signal $V_{out2}$ has a voltage between 0 V (the lowest voltage) and 5 V (the highest voltage) when CS = "0", $V_{in}$ = "1", and $\overline{V_{in}}$ = "0" ($V_{out1}$ would be "0").

In this circuit too, the transistors can be made small and the operation speed fast because the "zero" threshold-mode MOS transistor is connected between the depletion-mode MOS transistor and the enhancement-mode MOS transistor.

Figure 5:
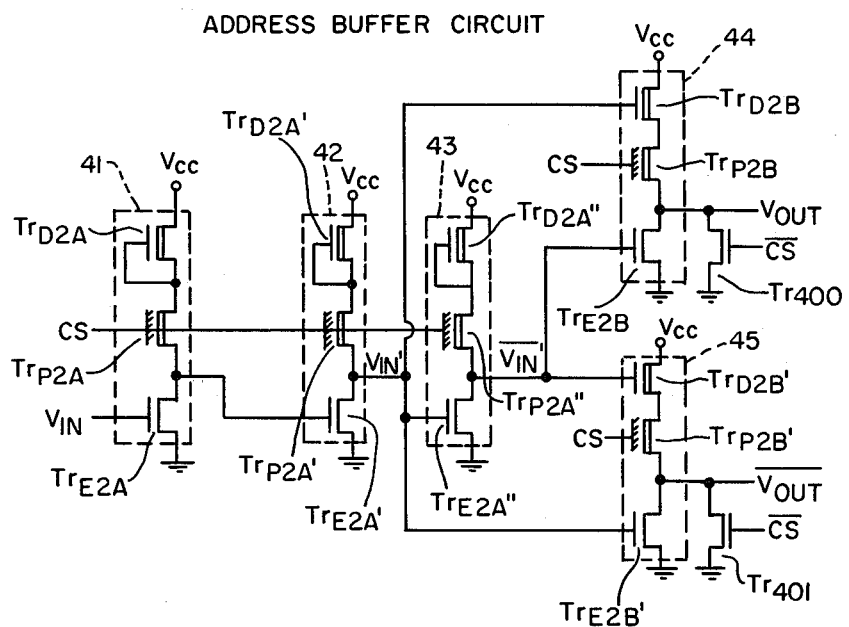
FIG. 5 shows another address buffer circuit for a static RAM using the circuits of FIG. 2A and FIG. 2B.

FIG. 5 shows an application of the inverter circuits in FIGS. 2A and 2B. The circuit in FIG. 5 is an address buffer which could be used in a static RAM. In the circuit of FIG. 5, the elements of the circuits of FIGS. 2A and 2B which have already been described will not be re-explained.

The address buffer in FIG. 5 includes three E/D inverter circuits, 41, 42 and 43, two Push-Pull inverter circuits, 44 and 45, and two enhancement-mode MOS transistors, $Tr_{400}$ and $Tr_{401}$. Inverters 41, 42 and 43 are the same circuit as was described with reference to FIG. 2A; inverters 44 and 45 are the same as the inverter in FIG. 2B.

The output of inverter 41 is the input to inverter 42. The output of inverter 42 is in turn the input signal of the inverters 43 and 45, and is also the inverted input signal of circuit 44. The output of inverter 43 is both the input of circuit 44 and the inverted input of circuit 45.

The enhancement-mode MOS transistor $Tr_{400}$ has its source connected to ground and its drain connected to the drain of transistor $Tr_{E2B}$ in inverter 44. The gate of $Tr_{400}$ receives an inverted chip select signal $\overline{CS}$.

The source of enhancement-mode MOS transistor $Tr_{401}$ is also connected to ground and its drain is connected to the drain of the transistor $Tr_{E2B}'$ in inverter 45. $Tr_{401}$'s gate also receives the inverted chip select signal $\overline{CS}$.

Input signal $V_{in}$ is applied to the gate of $Tr_{E2A}$ in inverter 41. $V_{out}'$, the output signal, appears at the drain of $Tr_{E2B}$ in inverter circuit 44. The inverted output signal $\overline{V_{out}}$ is taken at the drain of $Tr_{E2B}'$ in inverter 45.

Inverters 41 and 42 serve as input signal buffers. $V_{in}'$, the signal at the drain of $Tr_{E2A}'$ in inverter 42, has the same logic level as does $V_{in}$. $V_{in}'$ and $\overline{V_{in}}'$, which is at the drain of $Tr_{E2A}''$ in inverter 43, drive the complementary Push-Pull inverters 44 and 45 to produce outputs $V_{out}$ and $\overline{V_{out}}$. $V_{out}$ has the same logic level as does $V_{in}$.

In all of the circuits discussed to this point, in particular the inverters in FIGS. 2A, 2B, 4, and 5, only one "zero" threshold-mode MOS transistor is connected between the depletion-mode MOS transistor and the enhancement-mode MOS transistor. This need not be the case. Instead, a plurality of "zero" threshold-mode MOS transistors may be used in place of the single "zero" threshold mode transistor.

Figure 6:
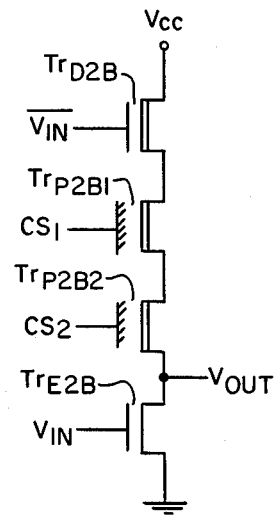
FIG. 6 shows an MOS transistor Push-Pull inverter circuit with a power-down function according to the present invention.

FIG. 6 shows a MOS Push-Pull inverter circuit with a power-down function. The inverter has a plurality of "zero" threshold-mode MOS transistors between the driver and load transistors. The single "zero" threshold-mode MOS transistor $Tr_{P2B}$, used in the circuit in FIG. 2B for the power-down function, is replaced by two "zero" threshold-mode MOS transistors, $Tr_{P2B1}$ and Tr$_{P2B2}$, to provide the same power-down function. Otherwise, the circuit in FIG. 6 is substantially the same as that of FIG. 2B. The same parts of the circuits in FIG. 6 and FIG. 2B have the same labels and will not be redescribed.

The first "zero" threshold-mode MOS transistor, Tr$_{P2B1}$, has a threshold voltage of approximately zero volts. Its drain is connected to the source of the depletion-mode MOS load transistor Tr$_{D2B}$. Tr$_{P2B1}$'s gate receives the first circuit enable signal (CS$_1$) which can be, for example, a chip select signal.

The source of Tr$_{P2B1}$ connects to the drain of the second "zero" threshold-mode MOS transistor, Tr$_{P2B2}$. Transistor Tr$_{P2B2}$ also has a threshold voltage of approximately zero volts. Its gate receives the second circuit enable signal (CS$_2$). The source of Tr$_{P2B2}$ is connected to the drain of enhancement-mode MOS driver transistor Tr$_{E2B}$. The output V$_{out}$ is taken from the drain of the transistor Tr$_{E2B}$.

Figure 7:
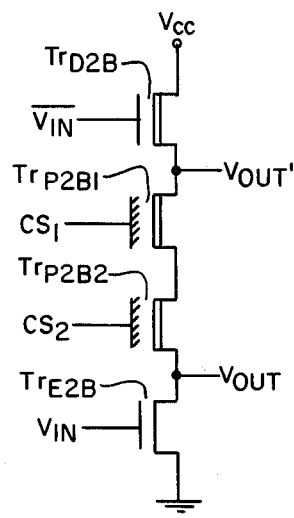
FIG. 7 shows yet another MOS transistor Push-Pull inverter circuit with a power-down function according to the present invention.

FIG. 7 shows that in the circuit of FIG. 6, an output signal may also be taken from the drain of one of the "zero" threshold-mode MOS transistors. The Push-Pull inverter circuit in FIG. 7 is substantially the same as that of FIG. 6 except that output signal V$_{out}'$ is taken at the Tr$_{P2B1}$ drain. In FIG. 7, it is preferable that the threshold voltages of the "zero" threshold-mode MOS transistors be less than 0 volts.

It will be apparent to those skilled in the art that various modifications and variations can be made in the MOS transistor circuit of this invention without departing from the scope or spirit of the invention. It is intended that the present invention cover the modifications and variations of this invention provided that they come within the scope of the appended claims and their equivalents.

What is claimed is:

1. A transistor circuit having a first input terminal, a second input terminal, and a circuit enable terminal, said circuit comprising:
   (a) a depletion-mode MOS transistor having a source, a drain, and a gate, the latter gate being connected to said first input terminal;
   (b) an enhancement-mode MOS transistor having a drain, a source, and a gate, the latter gate being connected to said second input terminal; and
   (c) an MOS transistor connected between said depletion-mode transistor and said enhancement-mode transistor for providing a power-down function, said power-down function transistor having a threshold voltage of approximately zero volts and also having a drain connected to said source of said depletion-mode MOS transistor, a source connected to said drain of said enhancement-mode transistor, and a gate connected to said circuit enable terminal.

2. The transistor circuit in claim 1, wherein said depletion-mode MOS transistor is a load transistor and said enhancement-mode MOS transistor is a drive transistor.

3. The transistor circuit in claim 1, wherein said threshold voltage of said power-down function transistor is between $-0.5$ volts to 0.2 volts.

4. The transistor circuit in claim 1, wherein a chip select signal is inputted to said circuit enable terminal for enabling or powering-down said circuit.

5. The transistor circuit in claim 1, wherein an output terminal is connected to said drain of said enhancement-mode MOS transistor.

6. The transistor circuit in claim 1 further including a power supply having at least two terminals wherein said drain of said depletion-mode MOS transistor is connected to a first terminal of said power supply and said source of said enhancement-mode MOS transistor is connected to a second terminal of said power supply.

7. The transistor circuit in claim 6 wherein said first terminal of said power supply is at a more positive potential than is said second terminal.

8. The transistor circuit in claim 1 wherein said first input terminal is connected to said source of said depletion-mode MOS transistor and wherein an output terminal is connected to said drain of said enhancement-mode transistor.

9. The transistor circuit of claim 1 wherein said first input terminal is an inverted signal input terminal and wherein a first output terminal is connected to said drain of said enhancement-mode transistor.

10. The transistor circuit in claim 9 further including a second output terminal connected to said drain of said power-down function MOS transistor.

11. A MOS transistor circuit having an input terminal, an inverted signal input terminal, and a first number of circuit enable terminals, said circuit comprising:
   (a) an enhancement-mode MOS transistor acting as a driver, said enhancement-mode transistor having a source, a drain, and a gate, the latter gate being connected to said input terminal;
   (b) a depletion-mode MOS transistor acting as a load, said depletion-mode transistor having a source, a drain, and a gate, said latter gate being connected to said inverted signal input terminal; and
   (c) a first number of MOS transistors providing a power-down function, each of said power-down function transistors having a threshold voltage of approximately zero volts and also having a source, a drain and a gate, said latter gate being connected to a different one of said first number of circuit enable terminals, said first number of power-down function transistors being connected between said depletion-mode MOS transistor and said enhancement-mode MOS transistor in a serial source-to-drain arrangement wherein the drain of one of said first number of power-down function transistors is connected to said source of said depletion-mode transistor and the source of another of said first number of power-down function transistors is connected to said drain of said enhancement-mode transistor.

* * * * *

Notice of Adverse Decision in Interference

In Interference No. 101,124, involving Patent No. 4,384,220, M. Segawa and S. Ariizumi, MOS TRANSISTOR CIRCUIT WITH A POWER-DOWN FUNCTION, final judgment adverse to the patentees was rendered Apr. 17, 1986, as to claims 1, 2, 4–7, 9 & 10.

[*Official Gazette October 7, 1986.*]